US012710615B2

(12) United States Patent
Chen et al.

(10) Patent No.: US 12,710,615 B2
(45) Date of Patent: Aug. 18, 2026

(54) OPTICAL ELEMENT DRIVE MECHANISM

(71) Applicant: Actutek Corporation, Taoyuan City (TW)

(72) Inventors: Shu-Shan Chen, Taoyuan City (TW); Chieh-An Chang, Taoyuan City (TW); Pai-Jui Cheng, Taoyuan City (TW); Chao-Chang Hu, Taoyuan City (TW)

(73) Assignee: Actutek Corporation, Taoyuan City (TW)

( * ) Notice: Subject to any disclaimer, the term of this patent is extended or adjusted under 35 U.S.C. 154(b) by 104 days.

(21) Appl. No.: 18/770,920

(22) Filed: Jul. 12, 2024

(65) Prior Publication Data

US 2024/0361567 A1 Oct. 31, 2024

Related U.S. Application Data

(63) Continuation of application No. 17/459,874, filed on Aug. 27, 2021, now Pat. No. 12,066,688.

(Continued)

(51) Int. Cl.

*G02B 7/04* (2021.01)
*G01L 1/16* (2006.01)

(Continued)

(52) U.S. Cl.

CPC .................. *G02B 7/04* (2013.01); *G01L 1/16* (2013.01); *G02B 7/003* (2013.01); *G02B 7/02* (2013.01); *G02B 7/09* (2013.01); *G02B 7/1821* (2013.01); *G02B 13/001* (2013.01); *G02B 26/0816* (2013.01); *G02B 26/0875* (2013.01); *G02B 27/0006* (2013.01); *G02B 27/646* (2013.01); *G03B 5/00* (2013.01); *G03B 5/02* (2013.01); *G03B 17/12* (2013.01); *G06F 3/016* (2013.01); *H02K 41/0354* (2013.01);

(Continued)

(58) Field of Classification Search

None

See application file for complete search history.

(56) References Cited

U.S. PATENT DOCUMENTS

| | | | | |
|---|---|---|---|---|
| 12,066,688 B2 * | 8/2024 | Chen | ........................ | G02B 7/02 |
| 2001/0004420 A1 | 6/2001 | Kuwana et al. | | |
| 2020/0393637 A1 * | 12/2020 | Ryoo | .................. | G02B 27/646 |

FOREIGN PATENT DOCUMENTS

| | | |
|---|---|---|
| CN | 108957678 A | 12/2018 |
| CN | 212160198 U | 12/2020 |

(Continued)

OTHER PUBLICATIONS

Chinese Office Action issued in corresponding CN Application No. 202122056515.1, dated Jan. 6, 2022, 1 page.

(Continued)

*Primary Examiner* — Stephone B Allen
*Assistant Examiner* — Tamara Y. Washington
(74) *Attorney, Agent, or Firm* — Muncy, Geissler, Olds & Lowe, P.C.

(57) ABSTRACT

An optical element drive mechanism is provided. The optical element drive mechanism includes an immovable part, a movable part, and a drive assembly. The movable part is connected to an optical element that includes an optical axis. The movable part is movable relative to the immovable part. The drive assembly drives the movable part to move relative to the immovable part.

20 Claims, 17 Drawing Sheets

Related U.S. Application Data

(60) Provisional application No. 63/071,550, filed on Aug. 28, 2020.

(51) Int. Cl.

| | |
|---|---|
| ***G02B 7/00*** | (2021.01) |
| ***G02B 7/02*** | (2021.01) |
| ***G02B 7/09*** | (2021.01) |
| ***G02B 7/182*** | (2021.01) |
| ***G02B 13/00*** | (2006.01) |
| ***G02B 26/08*** | (2006.01) |
| ***G02B 27/00*** | (2006.01) |
| ***G02B 27/64*** | (2006.01) |
| ***G03B 5/00*** | (2021.01) |
| ***G03B 5/02*** | (2021.01) |
| ***G03B 17/12*** | (2021.01) |
| ***G06F 3/01*** | (2006.01) |
| ***H02K 41/035*** | (2006.01) |
| ***H03K 17/96*** | (2006.01) |
| ***H04N 23/54*** | (2023.01) |
| ***H04N 23/55*** | (2023.01) |
| ***H04N 23/68*** | (2023.01) |
| ***H10N 30/30*** | (2023.01) |

(52) U.S. Cl.

CPC ........... *H03K 17/964* (2013.01); *H04N 23/54* (2023.01); *H04N 23/55* (2023.01); *H04N 23/685* (2023.01); *H10N 30/302* (2023.02); *G03B 2205/0069* (2013.01); *H02K 41/0356* (2013.01); *H03K 2217/96062* (2013.01)

(56) References Cited

FOREIGN PATENT DOCUMENTS

| | | | |
|---|---|---|---|
| CN | 216013788 | U | 3/2022 |
| CN | 216817066 | U | 6/2022 |

OTHER PUBLICATIONS

An Office Action for CN Application No. 202110994145.8, dated Jun. 19, 2025 is attached (7 pgs).

An Office Action in corresponding CN Application No. 202110994145.8 issued on Dec. 24, 2025 is attached, 5 pages.

Office Action issued on May 12, 2026 for the corresponding Application No. 202110994145.8 in China, pp. 1-3.

* cited by examiner

OPTICAL ELEMENT DRIVE MECHANISM

CROSS REFERENCE TO RELATED APPLICATIONS

This application is a continuation of U.S. patent application Ser. No. 17/459,874, filed on Aug. 27, 2021, which claims the benefit of U.S. Provisional Application No. 63/071,550, filed on Aug. 28, 2020, the entirety of which is incorporated by reference herein.

BACKGROUND OF THE INVENTION

Field of the Invention

The present invention relates to a drive mechanism, in particular, to an optical element drive mechanism.

Description of the Related Art

As technology has developed, many electronic devices (such as tablet computers and smartphones) may be used for capturing images and recording video. The optical element and the optical element drive mechanism in the electronic device allow the user to use the electronic device to capture images and record video. When the electronic device is being used, shock or vibration may occur, and this may cause the images or video to come out blurry. Therefore, the demand for higher quality images and video is increasing.

BRIEF SUMMARY OF THE INVENTION

An optical element drive mechanism is provided. The optical element drive mechanism includes an immovable part, a movable part, and a drive assembly. The movable part is connected to an optical element that includes an optical axis. The movable part is movable relative to the immovable part. The drive assembly drives the movable part to move relative to the immovable part.

In some embodiments, the drive assembly includes a piezoelectric element, a resilient element, a transmission element, a contact element, and a compression element. The piezoelectric element includes a piezoelectric material. The piezoelectric element generates a driving force. The resilient element disposed on the piezoelectric element. The transmission element extends in a first direction. The transmission element transmits the driving force. The contact element is in direct contact with the transmission element. The compression element generates a compression force, so that the contact element is in contact with the transmission element. The compression element has a compression-element opening corresponding to the contact element, and the contact element is received in the compression-element opening. The driving force is transmitted to the contact element by the transmission element, and the compression element thereby drives the movable part to move relative to the immovable part in the first direction. The movable part includes a holder, the holder and the compression element include different materials, and the Young's modulus of the holder is less than the Young's modulus of the compression element. The compression element is fixedly connected to the holder via a first adhesive element.

In some embodiments, the optical element drive mechanism further includes a dust-proof element disposed on the immovable part or the movable part. The dust-proof element is used to restrict movement of a particle. The dust-proof element includes an adhesive material. The dust-proof element includes a plastic material. Even if the dust-proof element solidifies, a surface of the dust-proof element is still sticky and therefore the particle still adheres to the surface of the dust-proof element. In some embodiments, when viewed from the first direction, the transmission element is surrounded by the dust-proof element. There is a first distance between the dust-proof element and the transmission element to prevent the dust-proof element from coming into contact with the transmission element. In some embodiments, when viewed from the first direction, there is a space between the transmission element and the contact element. The dust-proof element at least partially overlaps the space. When viewed from the first direction, the dust-proof element at least partially overlaps the piezoelectric element.

In some embodiments, the immovable part includes a case, a bottom, and a base plate, the case is connected to the base plate, and the bottom is disposed between the case and the base plate. The dust-proof element is disposed on at least one of the case, the bottom, and the base plate. The case and the base plate include a metal material, and the bottom includes a plastic material. The piezoelectric element is disposed between the bottom and the base plate. There is a gap between the drive assembly and the base plate. The minimum distance between the drive assembly and the bottom is less than the minimum distance between the drive assembly and the base plate.

In some embodiments, the optical element drive mechanism further includes a guidance assembly in contact with the movable part and the immovable part to guide the movable part to move relative to the immovable part in the first direction. In some embodiments, when viewed from the first direction, the immovable part is polygonal, and the drive assembly and the guidance assembly are disposed on different corners of the immovable part, respectively. In some embodiments, the guidance assembly is fixedly connected to the bottom via a second adhesive element. The guidance assembly includes a guidance element and a guidance plate. The guidance element is fixedly connected to the guidance plate, and the guidance plate is fixedly connected to the base plate. The guidance element has a rod structure extending in the first direction and passing through the bottom. The guidance plate has a plate-like structure. The guidance element and the guidance plate include a metal material, and the guidance element and the guidance plate include the same material. When viewed from a direction that is perpendicular to the first direction, the guidance plate is between the bottom and the base plate. In some embodiments, the guidance element is surrounded by the dust-proof element. There is a second distance between the dust-proof element and the guidance element to prevent the dust-proof element from coming into contact with the guidance element. In some embodiments, there are a plurality of guidance elements, each of the guidance elements extends in the first direction, and at least two of the guidance elements are disposed on a diagonal line.

In some embodiments, the optical element drive mechanism further includes a circuit assembly. The circuit assembly includes a circuit-assembly immovable portion and a circuit-assembly movable portion. the circuit-assembly immovable portion has a plate-like structure that is parallel with the first direction, the circuit-assembly movable portion is not parallel with the circuit-assembly immovable portion and is movable relative the movable part and the immovable part. The circuit-assembly movable portion is not parallel with the first direction. The circuit-assembly movable portion is movably connected to the piezoelectric element. When viewed from a direction that is perpendicular to the first direction, at least part of the circuit assembly is between the guidance plate and the base plate. In some embodiments, the optical element drive mechanism further includes a sensing assembly. The sensing assembly includes a reference element and a sensing element. The reference element is disposed on the movable part. The sensing element is disposed on the circuit-assembly immovable portion and electrically connected to the circuit assembly. The sensing element detects the reference element to find out a position of the movable part. In some embodiments, the circuit-assembly immovable portion includes an external connection portion passing through the base plate. When viewed from a direction that is perpendicular to the first direction, at least part of the circuit-assembly movable portion is located between the external connection portion and the sensing assembly. In some embodiments, the circuit-assembly movable portion includes a first segment and a second segment, the first segment and the second segment have a bar-like structure. In the first direction, a first junction of the first segment and the drive assembly is spaced apart from a second junction of the second segment and the drive assembly by a distance that is not zero. When viewed from the first direction, the circuit-assembly movable portion has a Y-shaped structure. In some embodiments, the resilient element is located between the first junction and the second junction. In some embodiments, the dust-proof element is disposed on a step-like structure on the bottom, the step-like structure includes a first surface and a second surface, the second surface is parallel with the first surface, and the first surface is closer to the case than the second surface. The dust-proof element is disposed on the first surface but not on the second surface.

In some embodiments, the dust-proof element is disposed in at least one of the following locations: between the holder and the case, between the holder and the bottom, and between the bottom and the base plate. In some embodiments, the holder includes a lateral stopper, the bottom includes a groove receiving the lateral stopper, the groove includes a groove side surface and a groove bottom surface, and when the movement of the holder reaches the limit, the lateral stopper is in contact with the groove side surface. The dust-proof element is disposed on the groove bottom surface but not on the groove side surface. In some embodiments, the holder includes a holder top surface and an upper stopper protruding from the holder top surface, the upper stopper is closer to the case than the holder top surface, and when the movement of the holder reaches the limit, the upper stopper is in contact with the case. The dust-proof element is disposed on the holder top surface but not on the upper stopper.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following disclosure provides many different embodiments, or examples, for implementing different features of the subject matter provided. Specific examples of components and arrangements are described below to simplify this disclosure. These are, of course, merely examples and are not intended to be limiting. For example, the formation of a first feature "on" and/or "above" a second feature in the description that follows may include embodiments in which the first and second features are formed in direct contact, and may also include embodiments in which additional features may be formed between the first and second features, so that the first and second features may not be in direct contact. The spatially relative terms are intended to encompass different orientations of the device in use or operation in addition to the orientation depicted in figures. The apparatus may be otherwise oriented (rotated 90 degrees or at other orientations) and the spatially relative descriptors used herein may likewise be interpreted accordingly. In addition, in different examples of this disclosure, symbols or alphabets may be used repeatedly.

Ordinal terms such as "first", "second", etc., used in the description and in claims do not by themselves connote any priority, precedence, or order of one element over another, but are used merely as labels to distinguish one element from another element having the same name. Unless the context requires otherwise, throughout the specification and claims that follow, the word "comprise", "have" and variations thereof, such as "comprises", "comprising", "having" are to be construed in an open, inclusive sense, that is, as "including, but not limited to."

Figure 1:
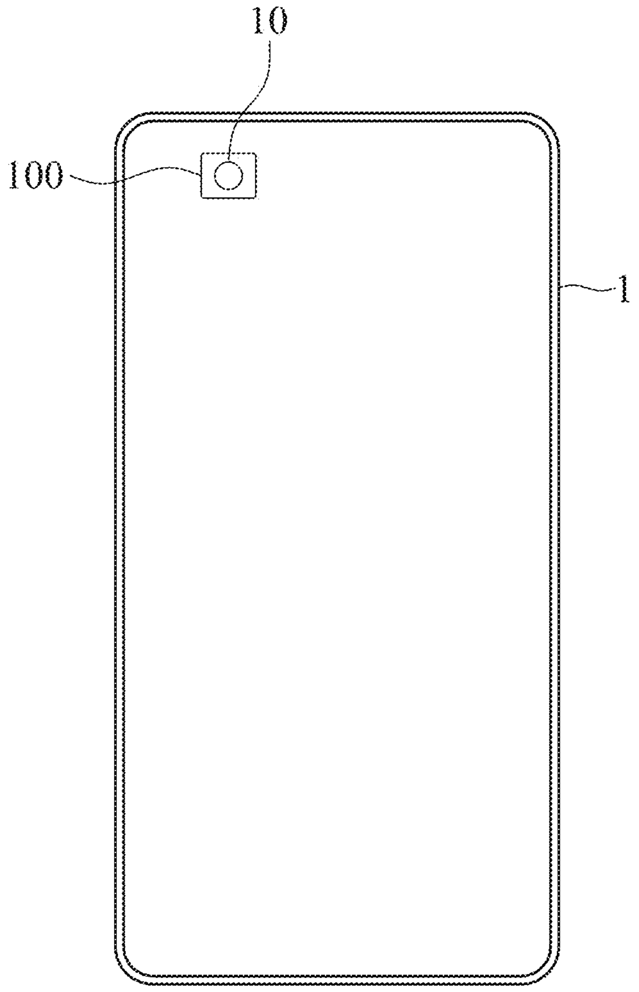
FIG. 1 is a schematic view of the electronic device, the optical element, and the optical element drive mechanism.
Figure 2:
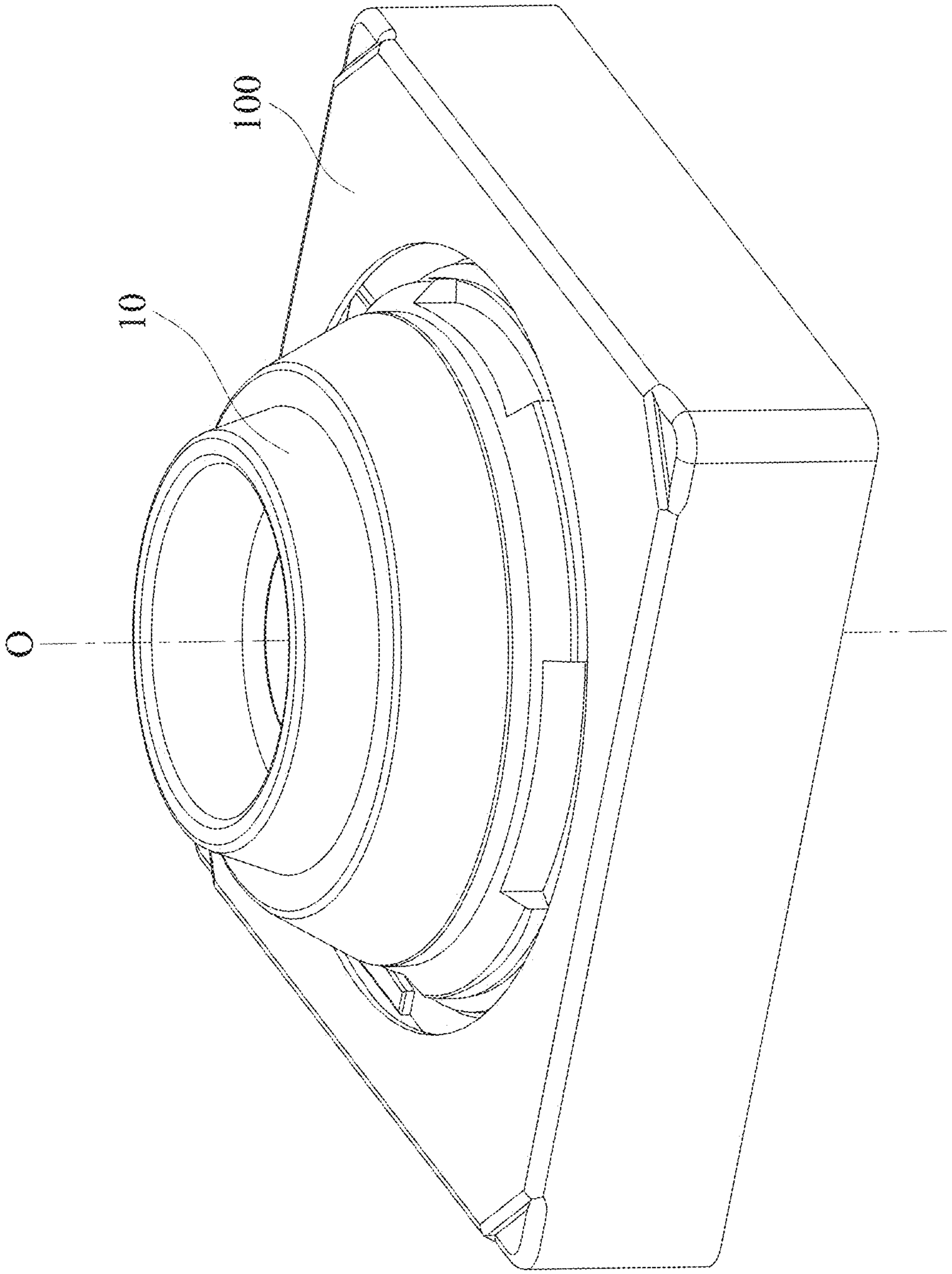
FIG. 2 is a schematic view of the optical element and the optical element drive mechanism.

Please refer to FIG. 1 and FIG. 2. FIG. 1 is a schematic view of an electronic device 1, an optical element 10, and an optical element drive mechanism 100. FIG. 2 is a schematic view of the optical element 10 and the optical element drive mechanism 100. The electronic device 1 may be a tablet computer, a smart phone, etc. The optical element 10 may be a lens. The optical element 10 may be made of plastic or glass. The optical element 10 may be circular or it may have another shape. The optical element 10 and the optical element drive mechanism 100 may be disposed in the electronic device 1, so that a user may capture images and record video. The optical element drive mechanism 100 may hold the optical element 10 and drive the optical element 10 to move, so as to adjust the position of the optical element 10 to capture clear images. The optical element 10 and the optical element drive mechanism 100 are typically placed in the top region of the electronic device 1 to increase the display area of the electronic device 1.

The optical element 10 has an optical axis O. The optical axis O is an imaginary axis passing through the center of the optical element 10. When the optical element 10 and the optical element drive mechanism 100 are aligned, the optical axis O substantially overlaps the central axis of the optical element drive mechanism 100. Therefore, in the followings and in the drawings, the optical axis O of the optical element 10 may be used to illustrate or describe the related features of the optical element drive mechanism 100. It should be noted that, since the optical element 10 is movably placed in the optical element drive mechanism 100, the optical axis O may be not exactly overlap the central axis of the optical element drive mechanism 100 because of the movement, shake, rotation, tilt of the optical element drive mechanism 100.

Figure 3:
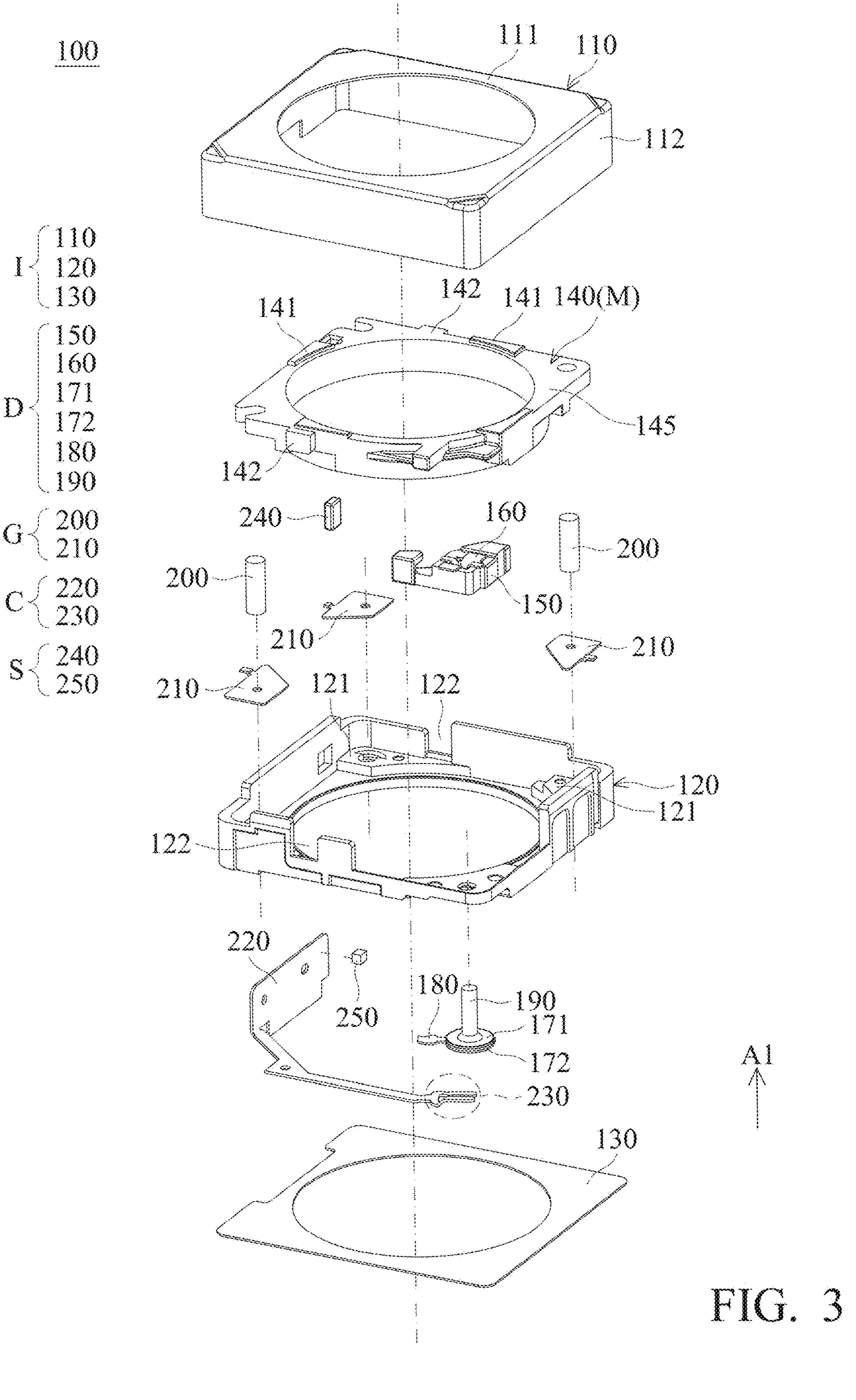
FIG. 3 is an exploded view of the optical element drive mechanism.

Next, please refer to FIG. 3. FIG. 3 is an exploded view of the optical element drive mechanism 100. The optical element drive mechanism 100 includes an immovable part I, a movable part M, a drive assembly D, a guidance assembly G, a circuit assembly C, and a sensing assembly S. The movable part M is connected to the optical element 10. The movable part M is movable relative to the immovable part I. The drive assembly D drives the movable part M to move relative to the immovable part I. The guidance assembly G may guide the movement of the movable part M relative to the immovable part I. The external circuits may be placed on the circuit assembly C, so that the current is supplied to the optical element drive mechanism 100. The sensing assembly S may detect the movement of the movable part M relative to the immovable part I. The description in the present disclosure is merely an example, and the elements may be added to or removed as needed. Also, for clear illustration, some elements may be omitted in the drawings.

In this embodiment, the immovable part I includes a case 110, a bottom 120, and a base plate 130. The case 110 is disposed above the bottom 120 and the base plate 130, and the bottom 120 is disposed between the case 110 and the base plate 130. The case 110 may be connected to the base plate 130. After the case 110 is connected to the base plate 130, the space formed therein may receive and protect the movable part M, the drive assembly D, the guidance assembly G, the sensing assembly S, and the like, to increase the structural strength of the overall optical element drive mechanism 100.

In some embodiments, the case 110 and the base plate 130 include a metal material. In some embodiments, the case 110 may be connected to the base plate 130 by laser welding. In some embodiments, the bottom 120 includes a plastic material, and part of the internal circuits may be formed in the bottom 120 by methods such as insert molding.

The case 110 has a top wall 111 and a plurality of side walls 112. The top wall 111 and the side walls have plate-like structures, and the top wall 111 is not parallel with the side walls 112. In some embodiments, the top wall 111 is substantially perpendicular to the side walls 112. The bottom 120 may include a plurality of bottom stages 121 and a plurality of bottom grooves 122. Each of the bottom grooves 122 may include a groove bottom surface 1221 and a groove side surface 1222 (denoted in FIG. 16).

In this embodiment, the movable part M includes a holder 140. The holder 140 is disposed between the case 110 and the bottom 120, and the holder 140 is spaced apart from the case 110 and the bottom 120 by a distance. That is, the holder 140 is not in direct contact with the case 110 and the bottom 120. The holder 140 is hollow to receive the optical element 10. In some embodiments, the holder 140 is made of plastic.

To prevent the holder 140 from being damaged when the movement of the holder 140 reaches the limit, the holder 140 may include one or more stoppers. In this embodiment, the holder 140 includes a plurality of upper stoppers 141 and a plurality of lateral stoppers 142. The upper stoppers 141 protrude from a holder top surface 145 of the holder 140. In particular, the upper stoppers 141 are closer to the case 110 than the holder top surface 145. The lateral stoppers 142 may be received in the bottom grooves 122 of the bottom 120. The upper stoppers 141 and the lateral stoppers 142 may restrict the movement range of the holder 140. For example, when the movement of the holder 140 toward the case 110 reaches the limit, the upper stoppers 141 of the holder 140 may be in contact with the case 110. For example, when the holder 140 vibrates or rotates, the lateral stoppers 142 of the holder 140 may be in contact with the groove side surface 1222 of the bottom groove 122 of the bottom 120.

Figure 4:
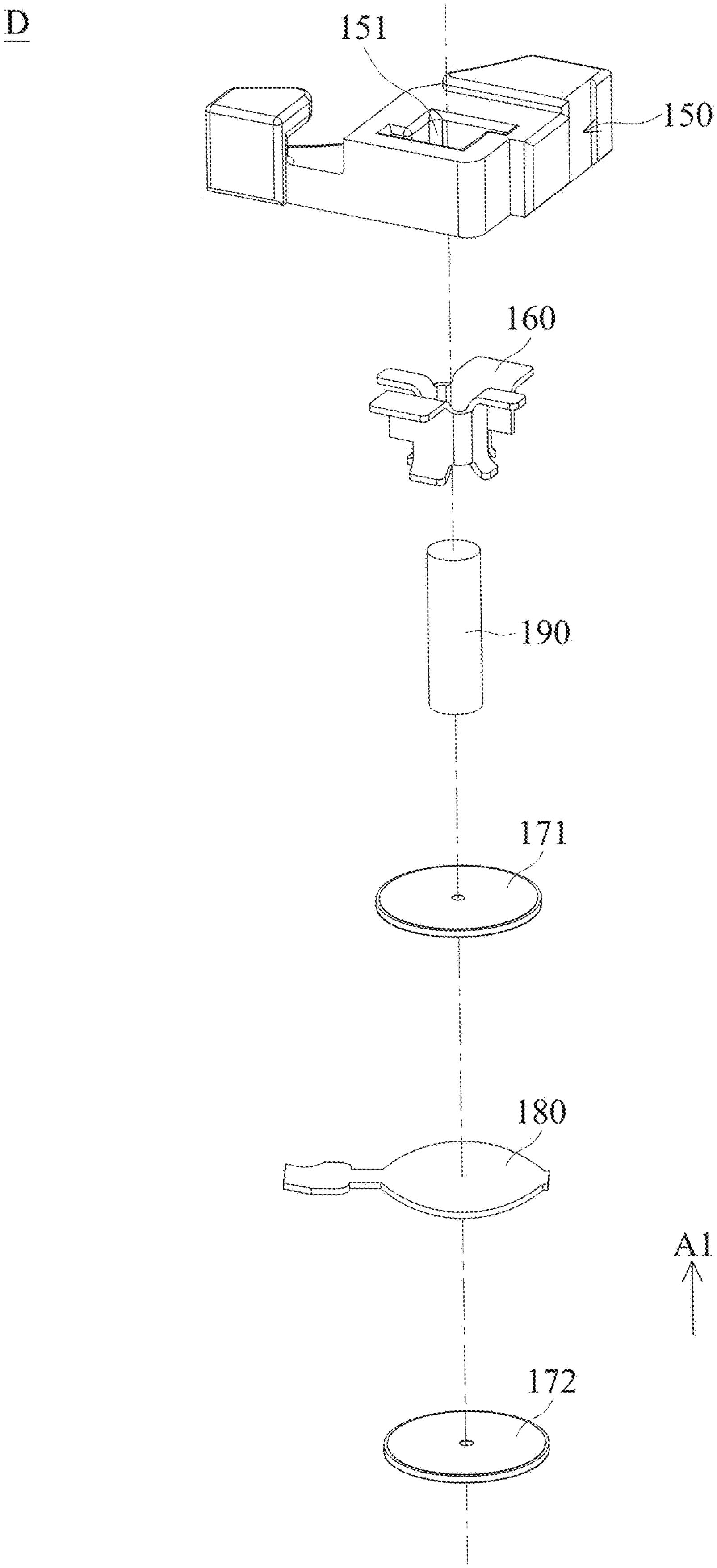
FIG. 4 is an exploded view of the drive assembly.
Figure 5:
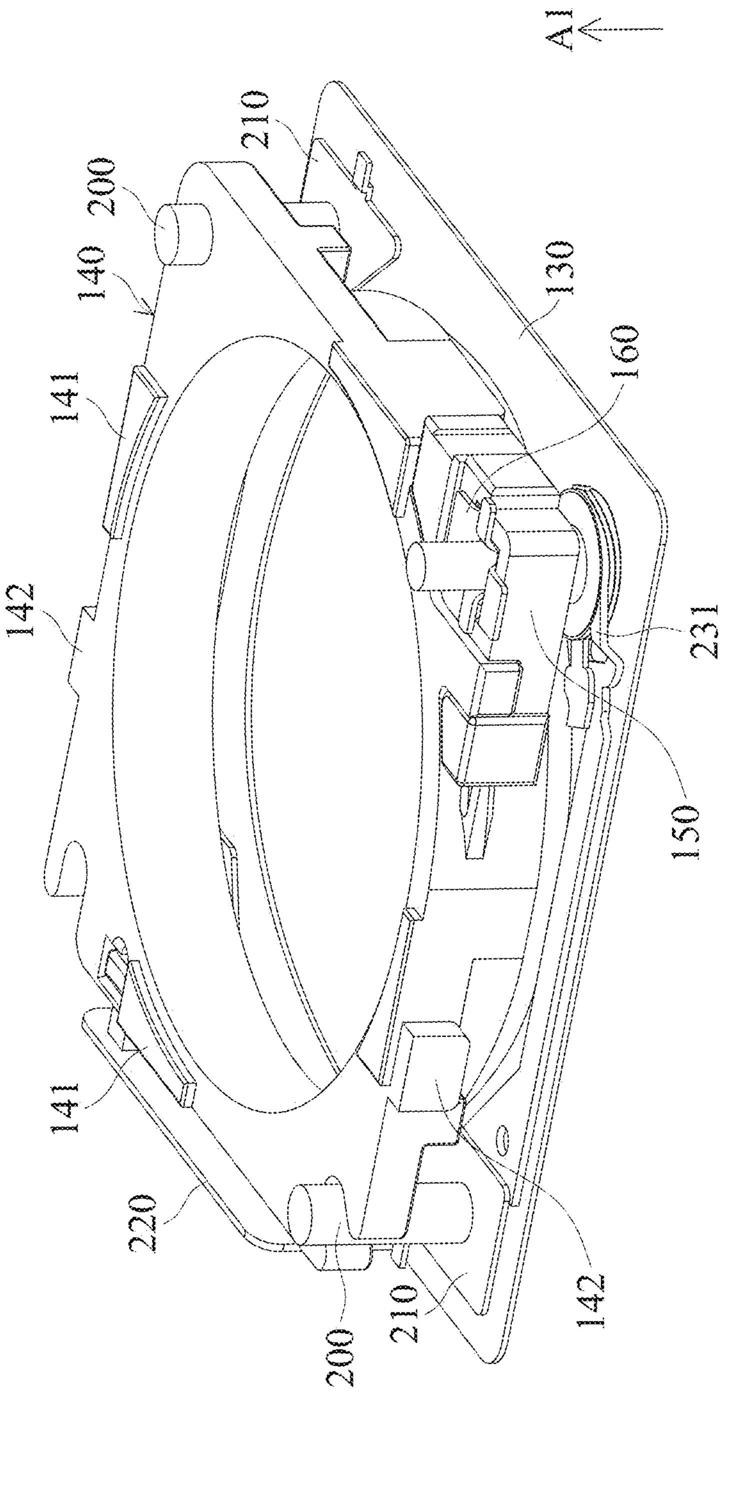
FIG. 5 and FIG. 6 are perspective views of the optical element drive mechanism from different perspectives.
Figure 6:
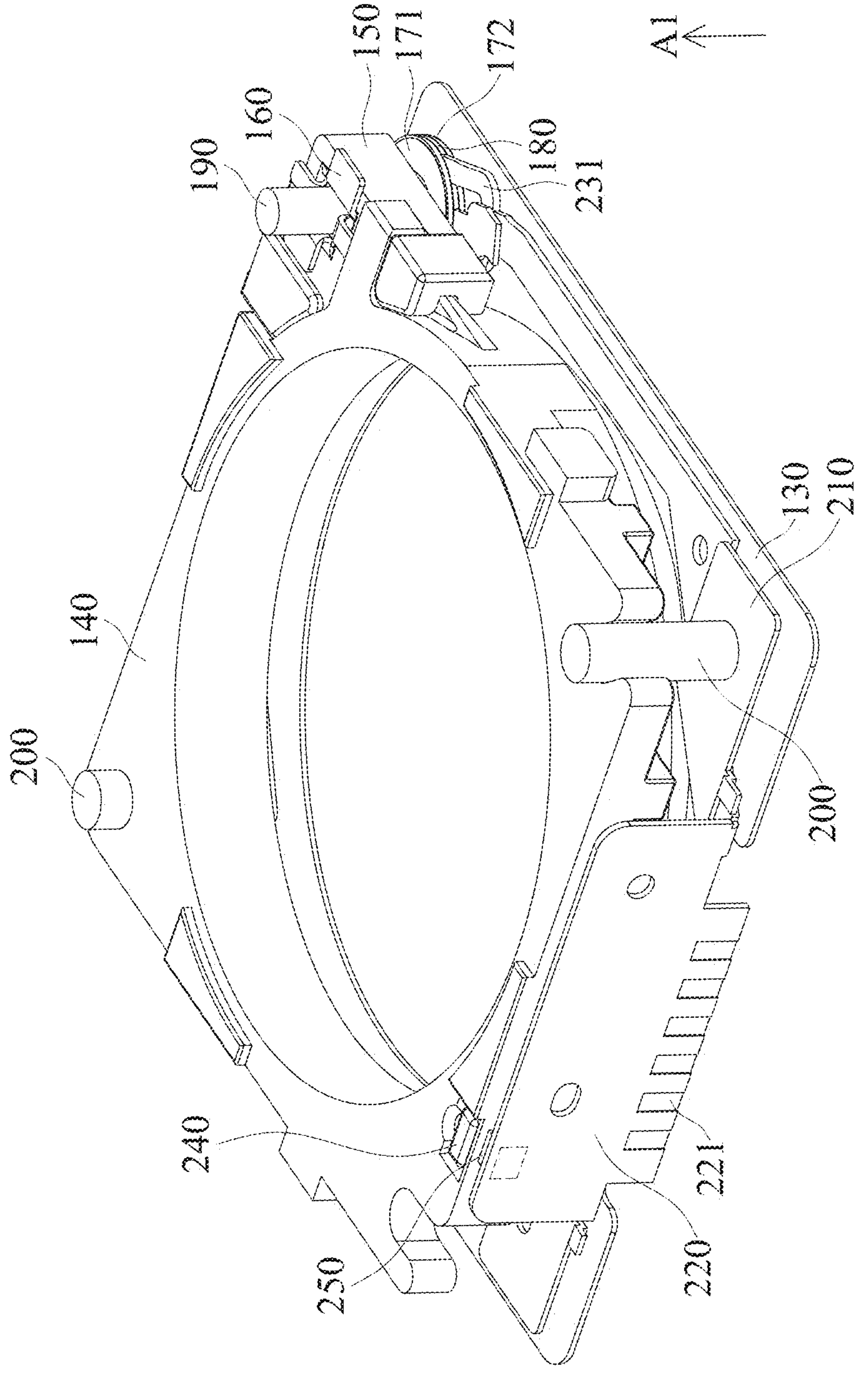
Figure 7:
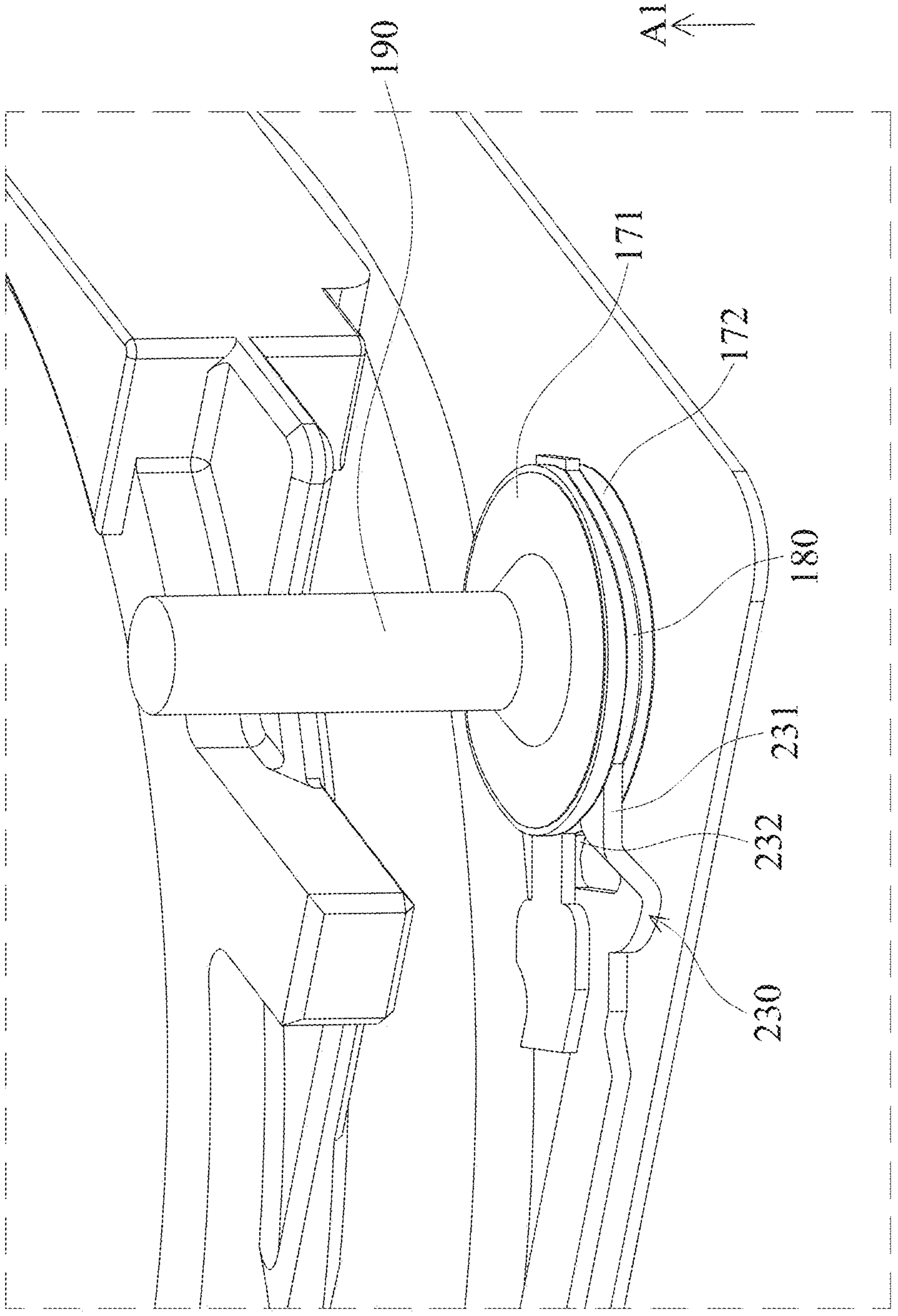
FIG. 7 and FIG. 8 are enlarged views of part of the optical element drive mechanism from different perspectives.

Next, in addition to FIG. 3, please also refer to FIG. 4 to FIG. 7 to understand the drive assembly D. FIG. 4 is an exploded view of the drive assembly D. FIG. 5 and FIG. 6 are perspective views of the optical element drive mechanism 100 from different perspectives. FIG. 7 is an enlarged view of part of the optical element drive mechanism 100. In this embodiment, the drive assembly D includes a compression element 150, a contact element 160, a first piezoelectric element 171, a second piezoelectric element 172, a resilient element 180, and a transmission element 190.

The compression element 150 is disposed above the bottom 120, and is in contact with the bottom 120, the holder 140, and the contact element 160. The compression element 150 is fixedly connected to the holder 140 via a first adhesive element (not shown). In some embodiments, the compression element 150 may be made of an elastic material, such as rubber. In some embodiments, the holder 140 and the compression element 150 include different materials, so the Young's modulus of the holder 140 and the Young's modulus of the compression element 150 are different. In some embodiments, the Young's modulus of the holder 140 is less than the Young's modulus of the compression element 150. If the Young's modulus of one element is different from that of another element, it may represent the elasticities of the elements are different or the hardness of the elements are different.

The compression element 150 includes a compression-element opening 151 corresponding to the contact element 160. The contact element 160 is disposed in the compression-element opening 151 and is in direct contact with the transmission element 190. The contact element 160 may be a single piece or a combination of multiple pieces. In some embodiments, the contact element 160 may be made of metal. The compression element 150 may generate a compression force, so the contact element 160 is in contact with the transmission element 190 in a more stable way.

The first piezoelectric element 171 and the second piezoelectric element 172 are located between the bottom 120 and the base plate 130. The first piezoelectric element 171 and the second piezoelectric element 172 may have substantially the same structures. For example, the first piezoelectric element 171 and the second piezoelectric element 172 may have plate-like structures. The first piezoelectric element 171 and the second piezoelectric element 172 may be made of a piezoelectric material, such as a metal material or a ceramic material. The minimum distance between the first piezoelectric element 171 and the bottom 120 is less than the minimum distance between the first piezoelectric element 171 and the base plate 130. That is, the first piezoelectric element 171 is closer to the bottom 120. The first piezoelectric element 171 and the second piezoelectric element 172 may deform to generate a driving force.

The resilient element 180 may have a plate-like structure. The resilient element 180 may be disposed between the first piezoelectric element 171 and the second piezoelectric element 172. The transmission element 190 may have a bar-like structure, such as a rod-like structure or a stick-like structure. The transmission element 190 may be a carbon rod. The transmission element 190 may extend in a first direction A1. When viewed from the first direction A1, the transmission element 190 may be circular. The transmission element 190 may be used for transmitting the driving force generated by the first piezoelectric element 171 and the second piezoelectric element 172 to the contact element 160. This is how the compression element 150 drives the holder 140 to move relative to the bottom 120 in the first direction A1.

In this embodiment, the first direction A1 is substantially parallel with the optical axis O, so the optical element 10 inside the holder 140 may be driven to move along the optical axis O to achieve auto focus (AF). The quality of the images is enhanced due to AF. However, the extending direction of the transmission element 190 may be changed to change the transmission direction of the driving force. In some other embodiments, the transmission element 190 extends in a direction that is perpendicular to the optical axis O, so the optical element 10 inside the holder 140 may be driven to move along the direction that is perpendicular to the optical axis O to achieve optical image stabilization (OIS). The deviation of the images caused by shake or being impacted and the problem of blurry images are compensated due to OIS.

Since the driving force generated by the first piezoelectric element 171 and the second piezoelectric element 172 is transmitted by the transmission element 190, the movement (including linear motion, rotation, etc.) of the movable part M is more stable, and high stability and high accuracy may be achieved.

Figure 8:
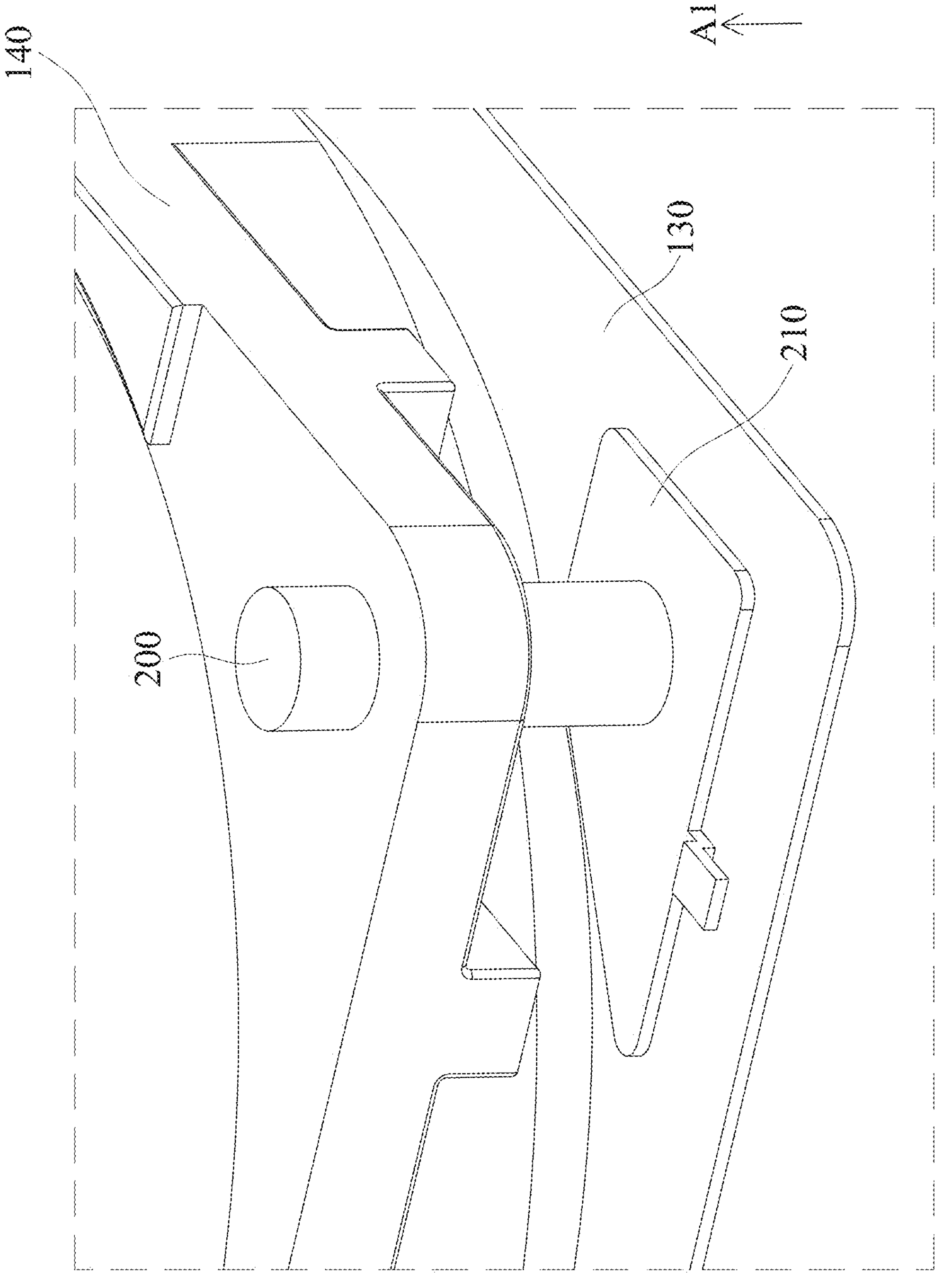

Next, in addition to FIG. 3, please also refer to FIG. 5, FIG. 6, and FIG. 8 to understand the guidance assembly G. FIG. 8 is an enlarged view of part of the optical element drive mechanism 100. The guidance assembly G is in contact with the movable part M and the immovable part I to guide the movable part M to move relative to the immovable part I in the first direction A1. In this embodiment, the guidance assembly G includes two guidance elements 200 and two guidance plates 210.

In this embodiment, when viewed from the first direction A1, the immovable part I is polygonal, and the drive assembly D and the two guidance elements 200 are disposed on three different corners of the immovable part I. In particular, the two guidance elements 200 are disposed on the diagonal line of the optical element drive mechanism 100. That is, the two guidance elements 200 are disposed on the diagonal line passing through the optical element 10. In some other embodiments, there may be only one guidance element 200 and only one guidance plate 210. In some other embodiments, there may be more guidance elements 200 and more guidance plates 210, and at least two of the guidance elements 200 are disposed on the diagonal line of the optical element drive mechanism 100.

The two guidance elements 200 may have substantially the same structure. The guidance elements 200 may each have a bar-like structure, such as a rod or a stick. The guidance elements 200 may extend in the first direction A1 and pass through the bottom 120. In some embodiments, the guidance elements 200 are fixedly connected to the bottom 120 via a second adhesive element. The guidance plates 210 may have plate-like structures. The guidance elements 200 are fixedly connected to the guidance plates 210, and the guidance plates 210 are fixedly connected to the base plate 130. In some embodiments, the guidance elements 200 may be connected to the guidance plate 210 by soldering. In some embodiments, the guidance plates 210 may be connected to the base plate 130 by laser welding. In some embodiments, the guidance elements 200 and the guidance plates 210 have a metal material. In some embodiments, the guidance elements 200 and the guidance plates 210 have the same material.

The guidance assembly G ensures that the movable part M only moves in a certain dimension (e.g. the first direction A1), and prevents unwanted shaking, rotating, or tilting of the movable part M.

Next, in addition to FIG. 3, please also refer to FIG. 5 to FIG. 7 to understand the circuit assembly C. When viewed from the first direction A1, the circuit assembly C is located on two sides of the optical element drive mechanism 100. When viewed from a direction that is perpendicular to the first direction A1, at least part of the circuit assembly C is located between the guidance plates 210 and the base plate 130.

The circuit assembly C includes a circuit-assembly immovable portion 220 and a circuit-assembly movable portion 230. The circuit-assembly immovable portion 220 has a plate-like structure that is parallel with the first direction A1. Furthermore, the circuit-assembly immovable portion 220 includes an external connection portion 221. The current may be supplied to the optical element drive mechanism 100 via the external connection portion 221. In particular, the external connection portion 221 may be connected to a power supply (not shown) outside the optical element drive mechanism 100, and the external connection portion 221 may include several pins. In this embodiment, the external connection portion 221 may pass through the base plate 130, so the overall thickness of the optical element drive mechanism 100 is reduced, and miniaturization is achieved.

The circuit-assembly movable portion 230 is connected to the circuit-assembly immovable portion 220. The circuit-assembly movable portion 230 is not parallel with the circuit-assembly immovable portion 220, and the circuit-assembly movable portion 230 is not parallel with the first direction A1. The circuit-assembly movable portion 230 may move relative to the movable part M and the immovable part I. When viewed from a direction that is perpendicular to the first direction A1, at least part of the circuit-assembly movable portion 230 is located between the external connection portion 221 and the sensing assembly S. In other words, in the first direction A1, at least part of the circuit-assembly movable portion 230 is located between the external connection portion 221 and the sensing assembly S.

When viewed from the first direction A1, the circuit-assembly movable portion 230 has a Y-shaped structure. In particular, the circuit-assembly movable portion 230 includes a first segment 231 and second segment 232, each of which has a bar-like structure. The first segment 231 and the second segment 232 are movably connected to the first piezoelectric element 171 and the second piezoelectric element 172, respectively. The current is supplied to one of the first piezoelectric element 171 and the second piezoelectric element 172, and the current flows out of the other of the first piezoelectric element 171 and the second piezoelectric element 172. In this way, the driving force is generated because of the change of volume, inertia, and friction force of the first piezoelectric element 171 and the second piezoelectric element 172.

Since the first segment 231 and the second segment 232 are respectively connected to the first piezoelectric element 171 and the second piezoelectric element 172 located on the opposite sides of the resilient element 180, the junction of the first segment 231 and the first piezoelectric element 171 and the junction of the second segment 232 and the second piezoelectric element 172 are located at different heights. In other words, in the first direction A1, a first junction of the first segment 231 and the drive assembly D is spaced apart from a second junction of the second segment 232 and the drive assembly D by a distance that is not zero, and the resilient element 180 is located between the first junction and the second junction.

Next, in addition to FIG. 3, please also refer to FIG. 6 to understand the sensing assembly S. In this embodiment, the sensing assembly S includes a reference element 240 and a sensing element 250. The reference element 240 may be a magnetic element. The sensing element 250 may be a Hall sensor, a Giant Magneto Resistance (GMR) sensor, a Tunneling Magneto Resistance (TMR) sensor, etc.

The reference element 240 is disposed at the movable part M. For example, the reference element 240 may be disposed on the holder 140. The sensing element 250 may be disposed at the circuit assembly C and electrically connected to the circuit assembly C. For example, the sensing element 250 may be disposed at the circuit-assembly immovable portion 220. The sensing element 250 may detect the reference element 240 to find out the position of the movable part M. In particular, the sensing element 250 may detect the change of the lines of magnetic field (including but not limited to the density of the lines of magnetic field and the direction of the lines of magnetic field) of the reference element 240 to find out the position of the holder 140.

Figure 9:
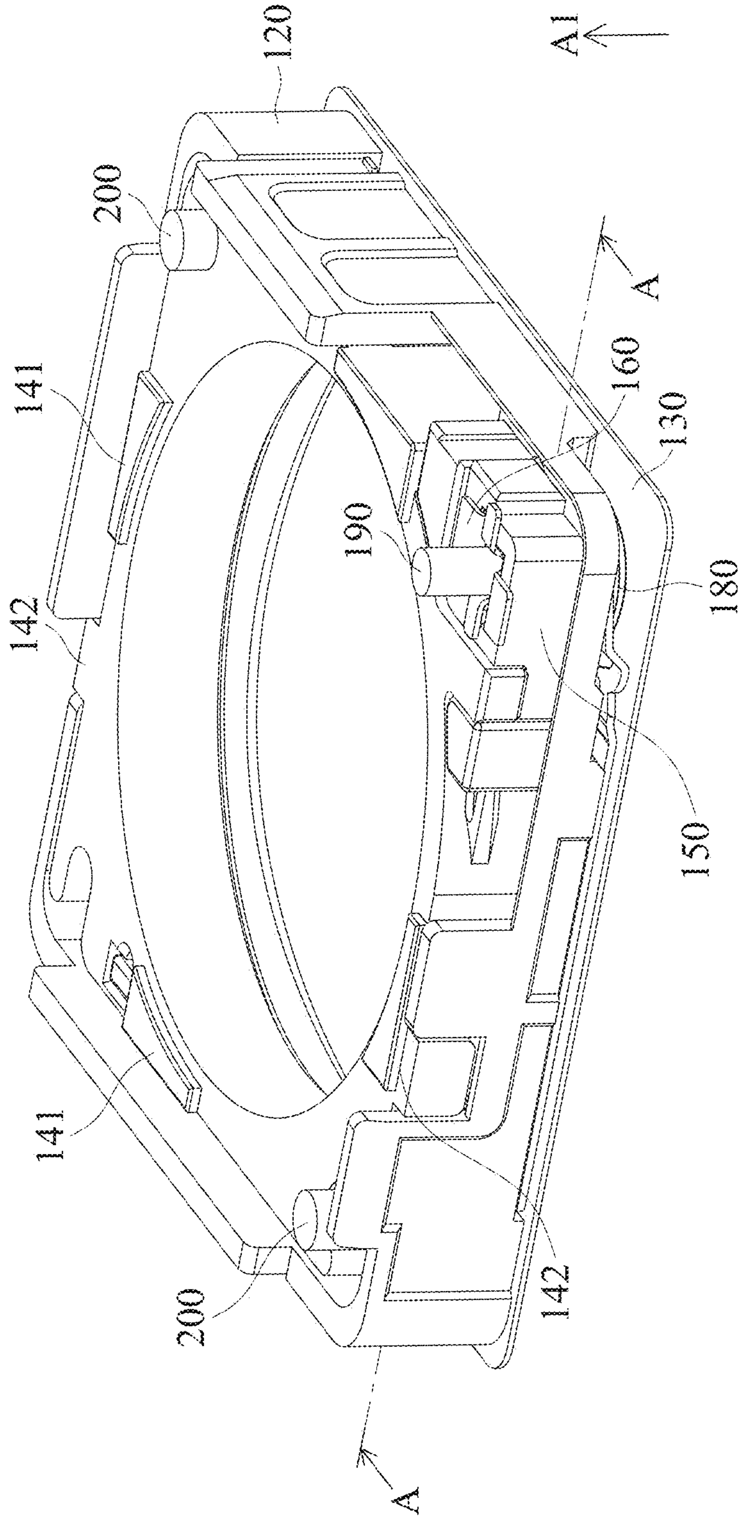
FIG. 9 is a perspective view of the optical element drive mechanism.
Figure 10:
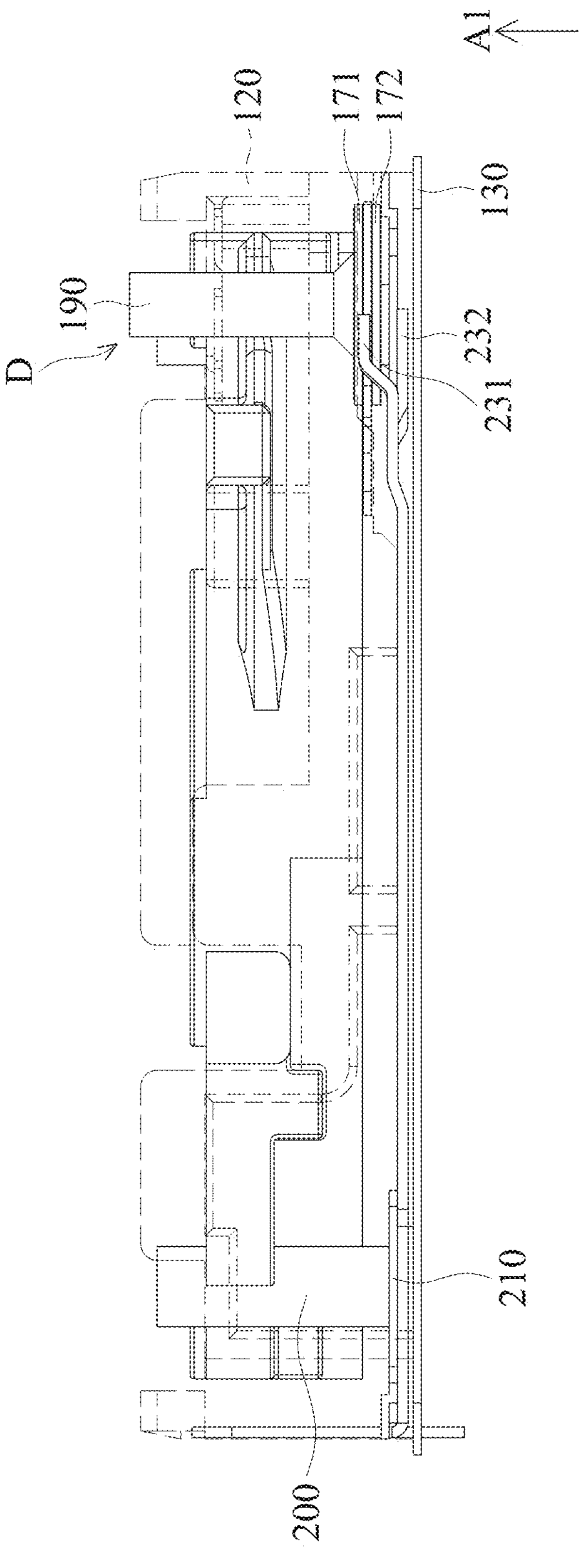
FIG. 10 is a cross-sectional view of the optical element drive mechanism along line A-A in FIG. 9.

Next, please refer to FIG. 9 and FIG. 10 to understand some features of the optical element drive mechanism 100. FIG. 9 is a perspective view of the optical element drive mechanism 100. FIG. 10 is a cross-sectional view of the optical element drive mechanism 100 along line A-A in FIG. 9, and the bottom 120 is illustrated in dotted lines. When viewed from a direction that is perpendicular to the first direction A1, the guidance plates 210 are located between the bottom 120 and the base plate 130. Also, there is a gap between the drive assembly D and the base plate 130, and the minimum distance between the drive assembly D and the bottom 120 is less than the minimum distance between the drive assembly D and the base plate 130. That is, the drive assembly D is closer to the bottom 120.

As described above, the first piezoelectric element 171 and/or the second piezoelectric element 172 may be used as a source of the driving force. Also, the holder 140 may be driven to move relative to the bottom 120 by the contact between the transmission element 190 and the contact element 160 of the drive assembly D. Additionally, the movement the movement of the holder 140 in a certain dimension is ensured by the guidance element 200 of the guidance assembly G. Furthermore, when the movement of the holder 140 reaches the limit, the holder 140 may be in contact with the case 110 and/or the bottom 120.

However, when an element is in contact with another element, particles such as debris and dust may be generated and the images may be affected. For example, particles may cause black dots on the images. Therefore, the optical element drive mechanism 100 may further include a dust-proof element 260 for restricting the movement of the particles. For example, the dust-proof element 260 may include an adhesive material for adhering to the particles. For example, the dust-proof element 260 may be a glue, an adhesive, etc. In some embodiments, the dust-proof element 260 includes a plastic material, such as resin. Additionally, even if the dust-proof element 260 solidifies, the surface of the dust-proof element 260 is still sticky, and the particles will still stick to it.

The amount and position of dust-proof elements 260 may be controlled to meet practical needs. For example, with any two elements that are in contact with each other, fewer particles will be generated if both elements are made of plastic than if one element is made of plastic and the other element is made of metal. For example, the dust-proof element 260 may be disposed at the immovable part I, at the movable part I, and/or between the immovable part I and the movable part M. For example, the dust-proof element 260 may be disposed between one or more of the case 110 and the holder, the holder 140 and the bottom 120, and the bottom 120 and the base plate 130. For example, the dust-proof element 260 may be disposed at one or more of the case 110, the bottom 120, the base plate 130, and the holder 140. It should be noted that the dust-proof element 260 is usually disposed on a surface that is close to the contact surface of an element, but not on the contact surface itself, as that would impair the proper functioning of the element.

Figure 11:
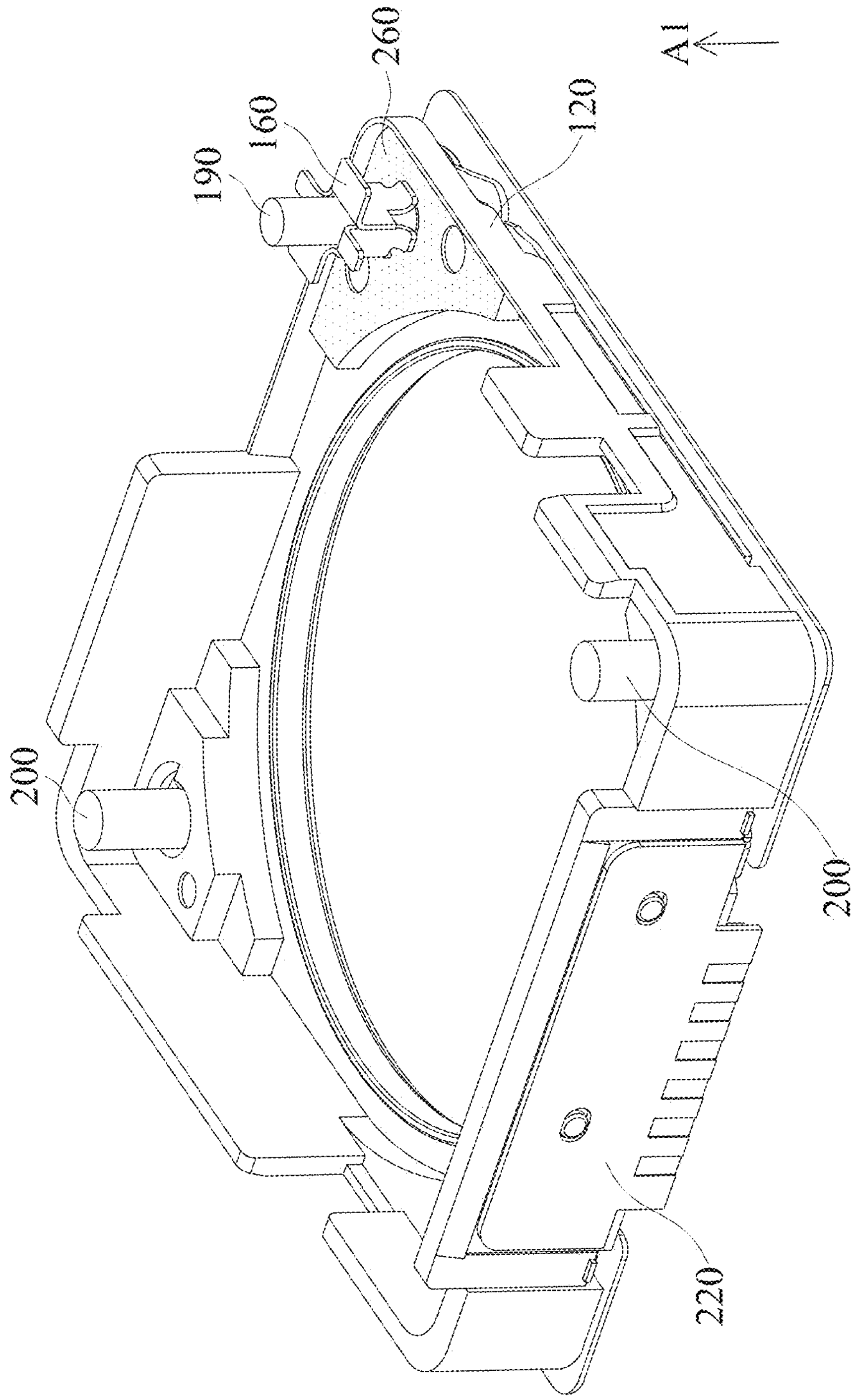
FIG. 11 is a perspective view of the optical element drive mechanism.
Figure 12:
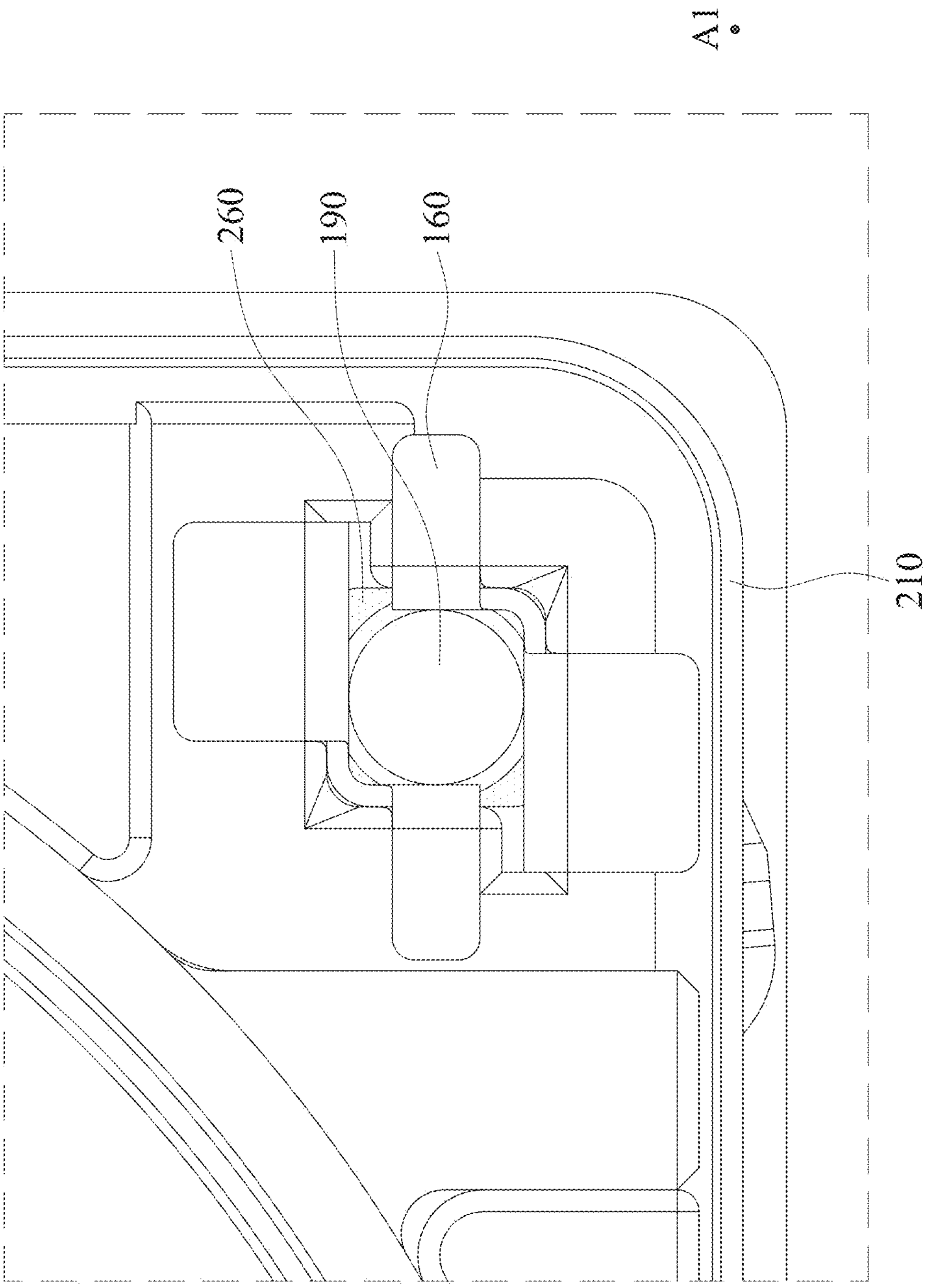
FIG. 12 is a top view of the optical element drive mechanism.
Figure 13:
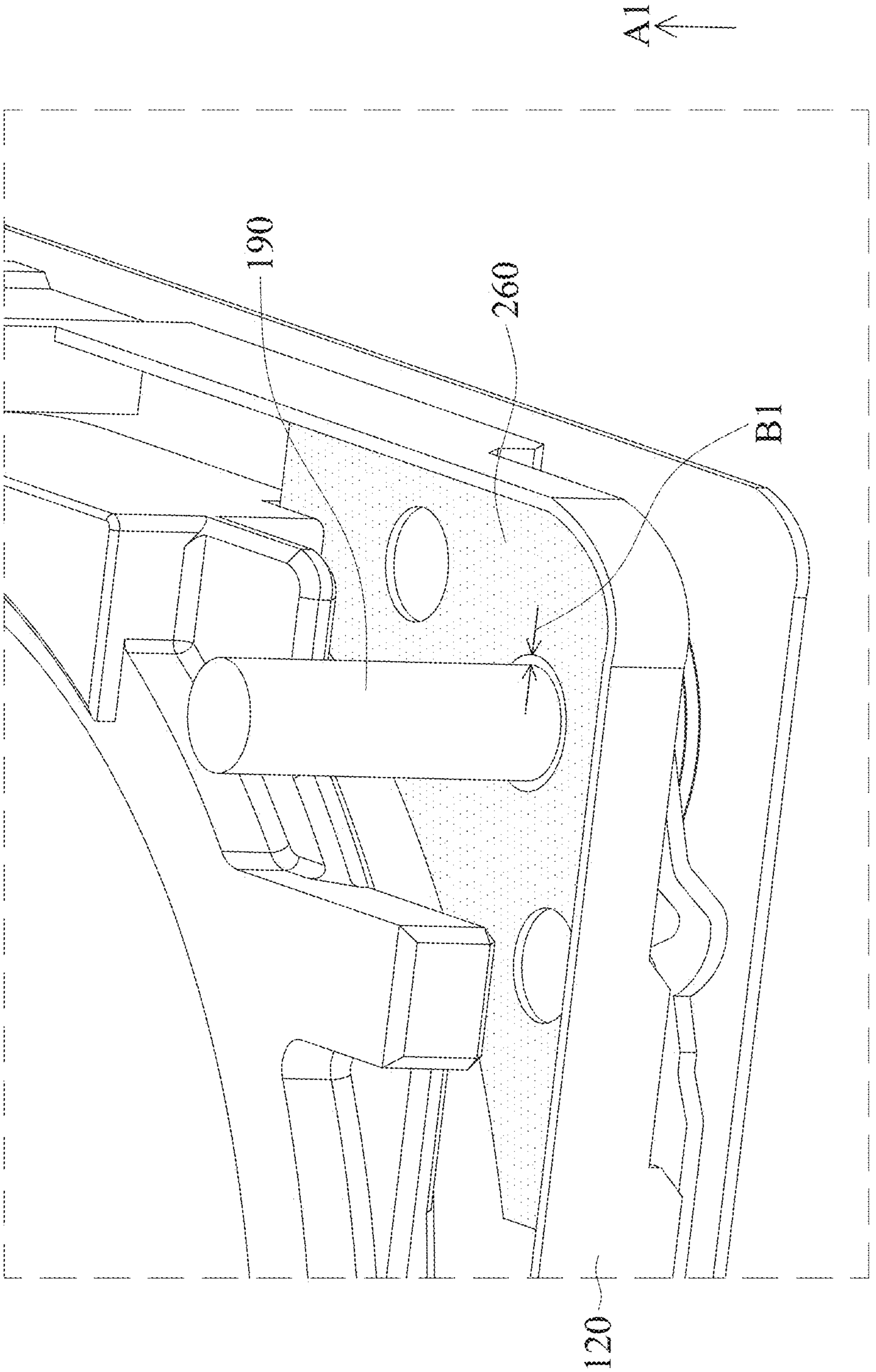
FIG. 13 and FIG. 14 are enlarged views of part of the optical element drive mechanism from different perspectives.

For simplification, the dust-proof element 260 in FIG. 11 to FIG. 17 is shown in mesh dots. Next, please refer to FIG. 11 to FIG. 13. FIG. 11 is a perspective view of the optical element drive mechanism 100. FIG. 12 is a top view of the optical element drive mechanism 100. FIG. 13 is an enlarged view of part of the optical element drive mechanism 100. In FIG. 11 to FIG. 13, the dust-proof element 260 is disposed on a surface of the bottom 120 that is close to the transmission element 190, and the transmission element 190 is surrounded by the dust-proof element 260, so the dust-proof element 260 mainly adhere to the particles that are generated by the contact between the transmission element 190 and the contact element 160. It should be noted that when viewed from the first direction A1, the dust-proof element 260 is a first distance B1 away from the transmission element 190. This is to prevent the dust-proof element 260 from coming into direct contact with the transmission element 190 (which may cause the transmission element 190 to fail to successfully transmit the driving force).

Also, when viewed from the first direction A1, the dust-proof element 260 at least partially overlaps the first piezoelectric element 171 and the second piezoelectric element 172. When viewed from the first direction A1, there is a space between the transmission element 190 and the contact element 160, and the dust-proof element 260 at least partially overlaps the space.

Figure 14:
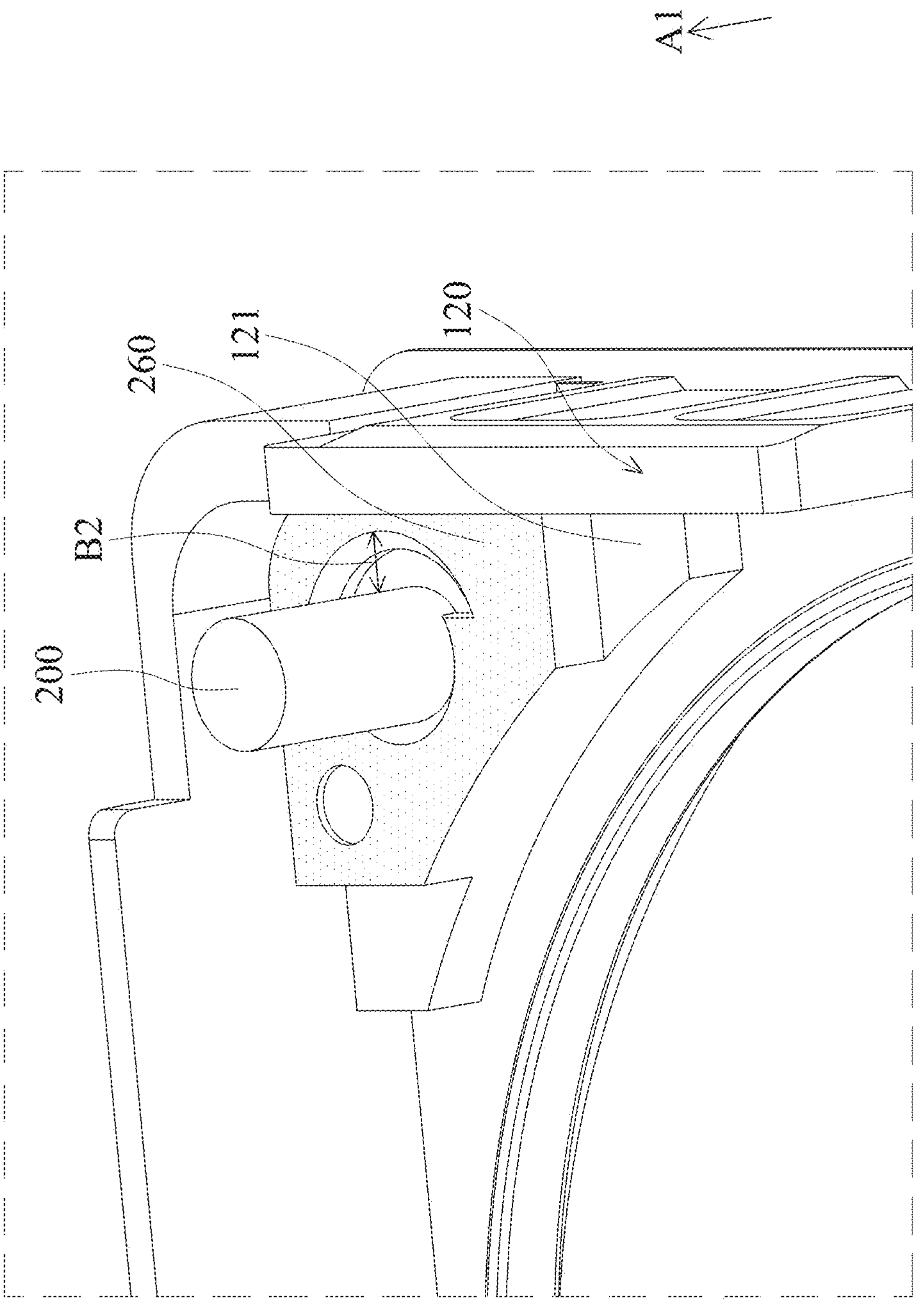

Next, please refer to FIG. 14. FIG. 14 is an enlarged view of part of the optical element drive mechanism 100. In FIG. 14, the dust-proof element 260 is disposed on surfaces of the bottom 120 that are close to the guidance elements 200, and the guidance elements 200 are surrounded by the dust-proof element 260, so the dust-proof element 260 mainly adhere to the particles that are generated by the contact between the guidance elements 200 and the holder 140. It should be noted that when viewed from the first direction A1, the dust-proof element 260 a second distance B2 away from the guidance elements 200 to prevent the dust-proof element 260 from coming into direct contact with the guidance elements 200 (which may cause the guidance elements 200 to fail to guide the movement of the holder 140).

It should be noted that no matter whether the dust-proof element 260 surrounds the transmission element 190 or the guidance elements 200, the portion of the bottom that surrounds the transmission element 190 and/or the guidance elements 200 may have a concave structure to further prevent the dust-proof element 260 from coming into direct contact with the transmission element 190 and/or the guidance elements 200.

Also, no matter whether the dust-proof element 260 surrounds the transmission element 190 or the guidance elements 200, the dust-proof element 260 may be disposed on a step-like structure (e.g. the bottom stage 121). The step-like structure includes a first surface and a second surface. The second surface is parallel with the first surface, and the first surface is closer to the case 110 than the second surface. The dust-proof element 260 is disposed on the first surface but not on the second surface. In this way, the possibility of spillover of the dust-proof element 260 is reduced.

Also, as shown in FIG. 13 and FIG. 14, during the manufacturing of the bottom 120, the product may be ejected (ejection) and thus an ejection hole may be formed on the bottom 120. In FIG. 13 and FIG. 14, the dust-proof element 260 is not disposed on the ejection hole, but it is acceptable to apply the dust-proof element 260 to the ejection hole.

Figure 15:
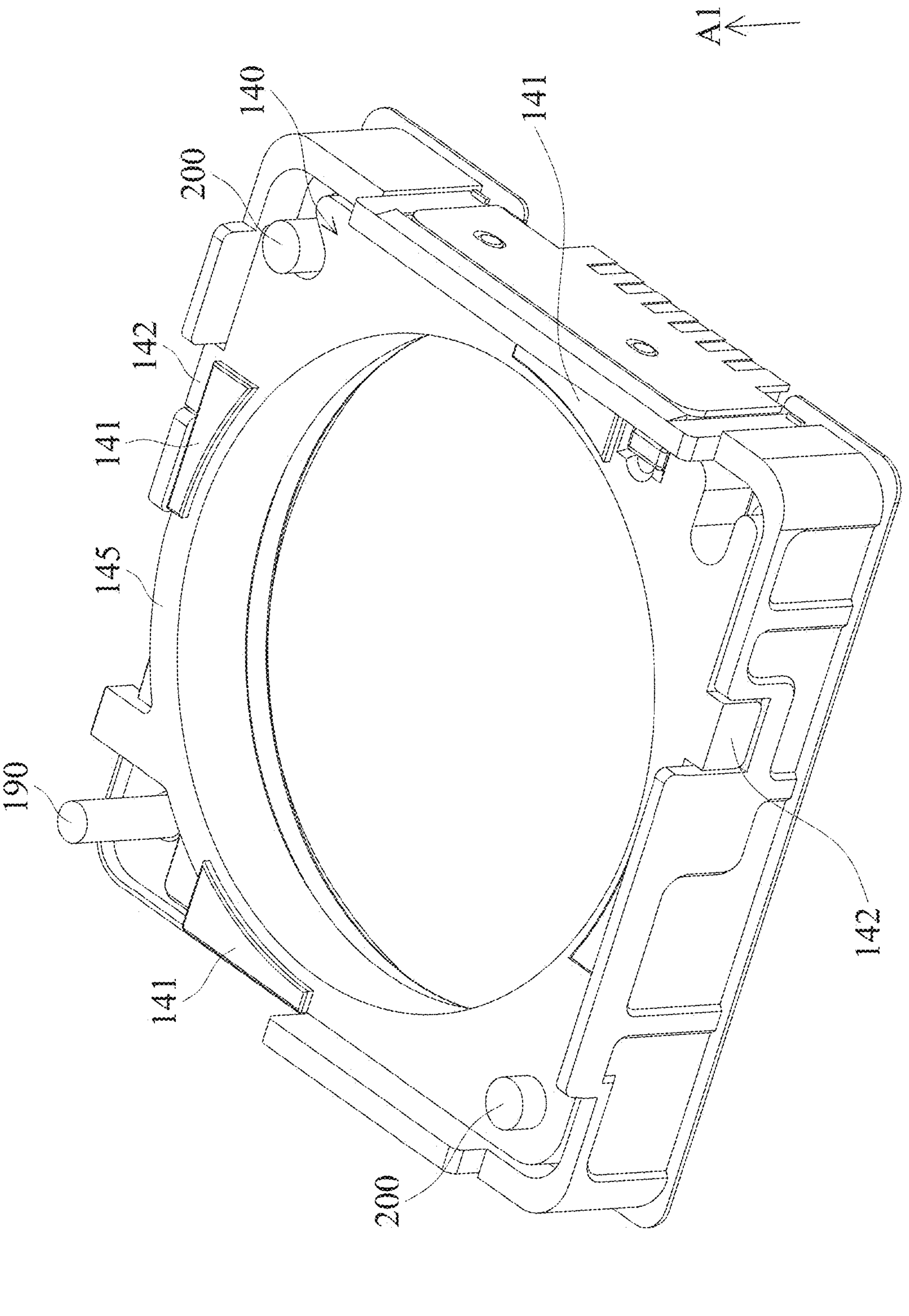
FIG. 15 is a top view of the optical element drive mechanism.
Figure 16:
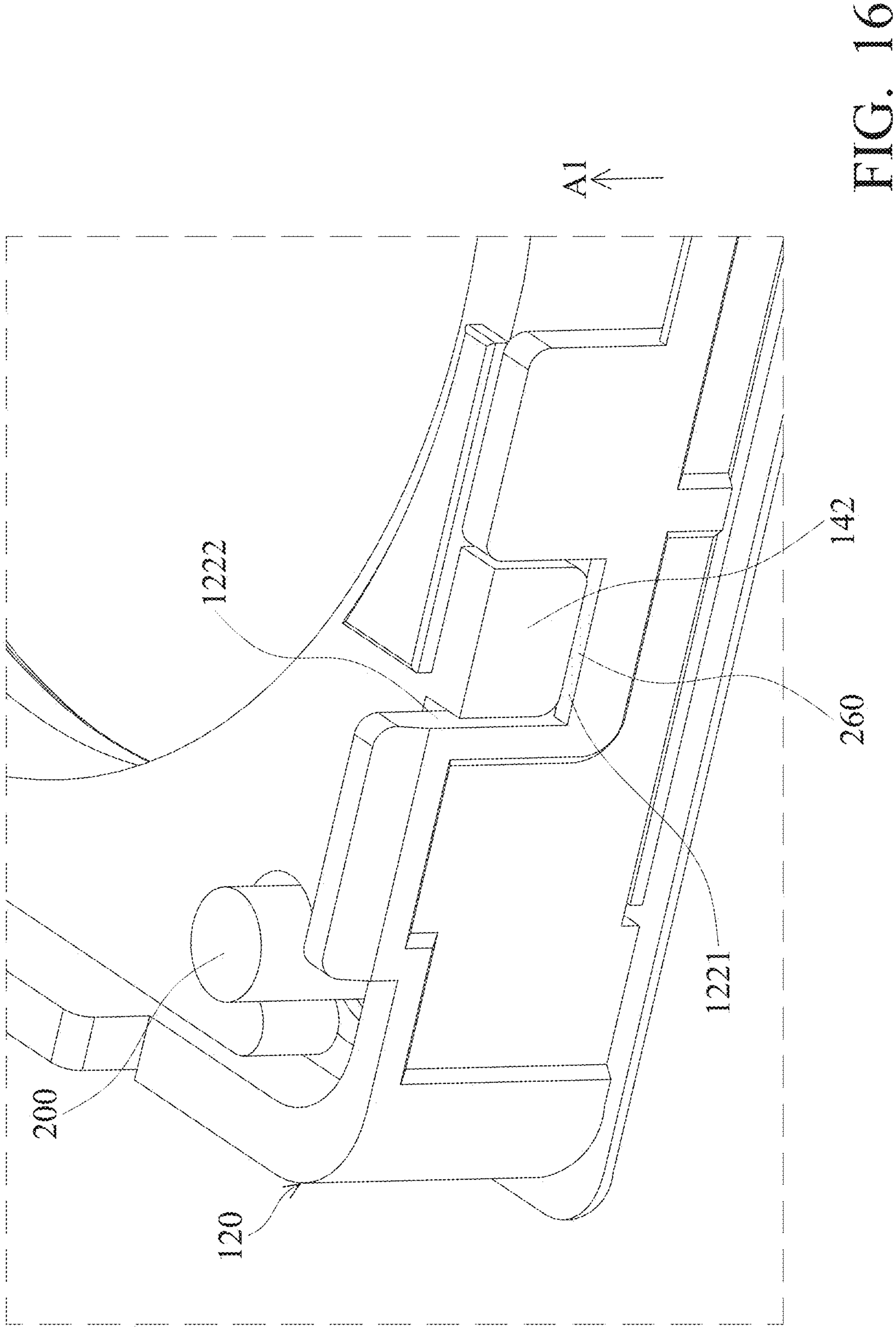
FIG. 16 and FIG. 17 are enlarged views of part of the optical element drive mechanism from different perspectives.

Next, please refer to FIG. 15 and FIG. 16. FIG. 15 is a top view of the optical element drive mechanism 100. FIG. 16 is an enlarged view of part of the optical element drive mechanism 100. In FIG. 15 and FIG. 16, the dust-proof element 260 is disposed on the groove bottom surface 1221 of the bottom groove 122 that is close to the lateral stopper (s) 142 of the holder 140 to mainly adhere to the particles that are generated by the contact between the lateral stopper (s) 142 of the holder 140 and the groove side surface 1222 of the bottom 120. It should be noted that the dust-proof element 260 is not applied to the groove side surface 1222 to prevent the dust-proof element 260 from coming into direct contact with the holder 140 when the rotation of the holder 140 reaches the limit.

Figure 17:
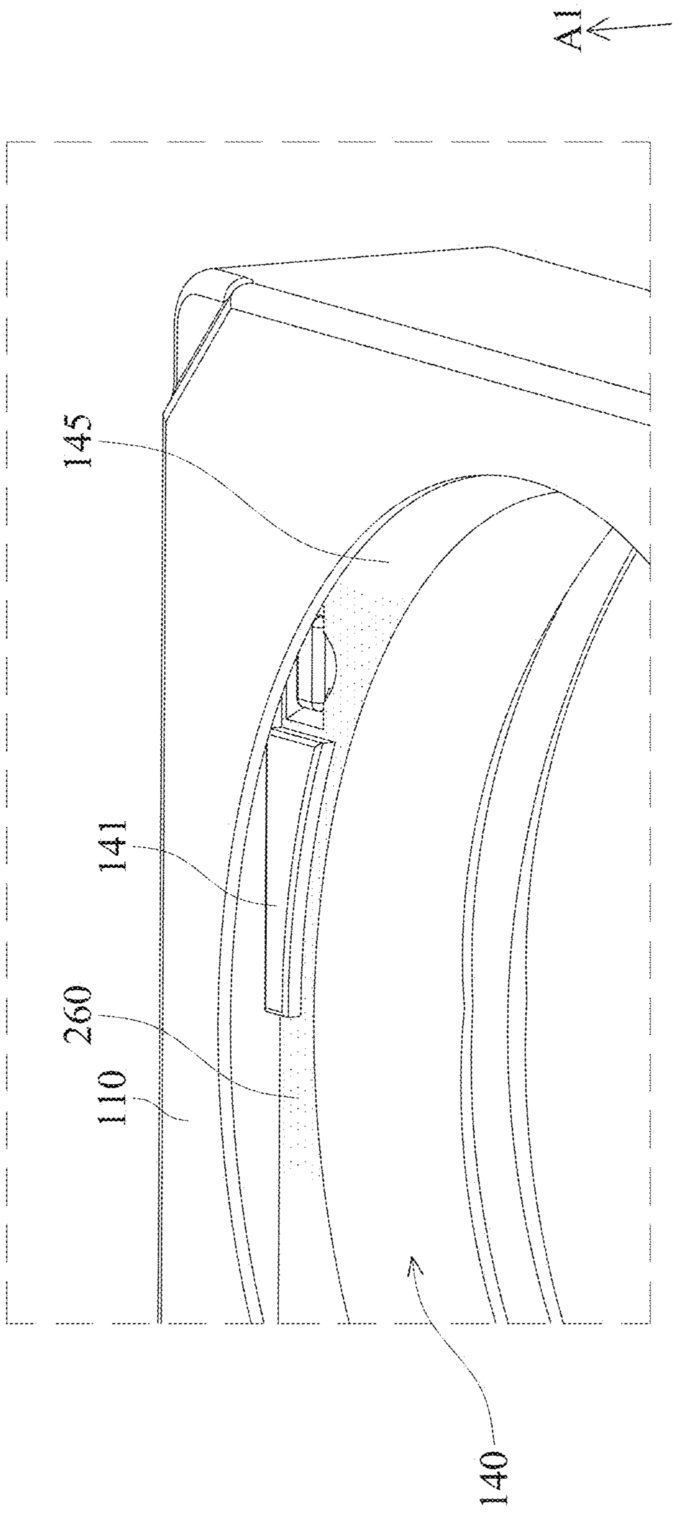

Next, please refer to FIG. 17. FIG. 17 is an enlarged view of part of the optical element drive mechanism 100. In FIG. 17, the dust-proof element 260 is disposed on the portion of the holder top surface 145 of the holder 140 that is close to the upper stopper(s) 141 of the holder 140 to mainly adhere to the particles that are generated by the contact between the upper stopper(s) 141 of the holder 140 and the case 110. It should be noted that the dust-proof element 260 is not applied to the upper stopper(s) 141 to prevent the dust-proof element 260 from coming into direct contact with the case 110 when the movement of the holder 140 reaches the limit.

It should be noted that the position of the dust-proof element 260 is not limited thereto. For example, the holder 140 may include a lower stopper located on the holder bottom surface. When the movement of the holder 140 toward the bottom 120 reaches the limit, the lower stopper may be in contact with the bottom 120. The dust-proof element 260 may be disposed at the portion of the holder bottom surface that is close to the lower stopper of the holder 140 and/or the portion of the bottom 120 that is close to the lower stopper of the holder 140.

As described above, the drive assembly of the present disclosure transmitting the driving force generated by the piezoelectric element by the transmission element, so that the movement of the movable part (including linear motion, rotation, etc.) is more stable, and high stability and high accuracy may be achieved. Also, the guidance assembly ensures that the movable part only moves in a certain dimension and prevents unwanted shaking, rotating, or tilting of the movable part. Furthermore, due to the dust-proof element, the negative effects on the images caused by the particles may be avoided. Also, the dust-proof element is disposed on the surface that is close to the contact surface of the element but not on the contact surface of the element to avoid abnormality of the element caused by the sticky contact surface of the element.

The foregoing outlines features of several embodiments so that those skilled in the art may better understand the aspects of this disclosure. Those skilled in the art should appreciate that they may readily use this disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of this disclosure. In addition, the scope of this disclosure is not limited to the specific embodiments described in the specification, and each claim constitutes a separate embodiment, and the combination of various claims and embodiments are within the scope of the disclosure.

What is claimed is:

1. An optical element drive mechanism, comprising:
an immovable part;
a movable part connected to an optical element that has an optical axis, wherein the movable part is movable relative to the immovable part;
a sensing assembly sensing the movement of the movable part; and
a drive assembly driving the movable part to move relative to the immovable part, wherein the drive assembly comprises:
a piezoelectric element comprising a piezoelectric material, wherein the piezoelectric element generates a driving force;
a transmission element extending in a first direction, wherein the transmission element transmits the driving force;
a contact element in direct contact with the transmission element; and
a compression element for generating a compression force, so that the contact element is in contact with the transmission element, wherein the compression element has a compression-element opening corresponding to the contact element, and the contact element is received in the compression-element opening,
wherein the driving force is transmitted to the contact element by the transmission element, and the compression element thereby drives the movable part to move relative to the immovable part in the first direction, and
wherein the contact element comprises a plurality of metal pieces located on different sides of the compression-element opening.

2. The optical element drive mechanism as claimed in claim 1, wherein the movable part comprises a holder, and Young's modulus of the holder is less than Young's modulus of the compression element.

3. The optical element drive mechanism as claimed in claim 2, further comprising a dust-proof element disposed on the immovable part or the movable part, wherein the dust-proof element comprises an adhesive material.

4. The optical element drive mechanism as claimed in claim 3, wherein when viewed from the first direction, the dust-proof element at least partially overlaps the piezoelectric element.

5. The optical element drive mechanism as claimed in claim 3, wherein when viewed from the first direction, the transmission element is surrounded by the dust-proof element, and there is a first space between the dust-proof element and the transmission element to prevent the dust-proof element from coming into contact with the transmission element.

6. The optical element drive mechanism as claimed in claim 4, wherein when viewed from the first direction, there is a second space between the transmission element and the contact element, and the dust-proof element at least partially overlaps the second space.

7. The optical element drive mechanism as claimed in claim 3, wherein the immovable part comprises a case, a base plate connected to the case, and a bottom disposed between the case and the base plate, and the dust-proof element is disposed on at least one of the case, the bottom, and the base plate.

8. The optical element drive mechanism as claimed in claim 3, wherein the movable part comprises a holder, the immovable part comprises a case, a base plate connected to the case, and a bottom disposed between the case and the base plate, and the dust-proof element is disposed in at least one of the following locations: between the holder and the case, between the holder and the bottom, and between the bottom and the base plate.

9. The optical element drive mechanism as claimed in claim 1, further comprising a guidance assembly in contact with the movable part and the immovable part to guide the movable part to move relative to the immovable part in the first direction.

10. The optical element drive mechanism as claimed in claim 9, wherein when viewed from the first direction, the immovable part is polygonal, and the drive assembly and the guidance assembly are disposed on different corners of the immovable part, respectively.

11. The optical element drive mechanism as claimed in claim 9, wherein the guidance assembly comprises a guidance element and a guidance plate connected to the guidance element, the guidance element has a rod structure extending in the first direction, and the guidance plate has a plate-like structure.

12. The optical element drive mechanism as claimed in claim 11, wherein the immovable part comprises a case, a base plate connected to the case, and a bottom disposed between the case and the base plate, and when viewed from a direction that is perpendicular to the first direction, the guidance plate is located between the bottom and the base plate.

13. The optical element drive mechanism as claimed in claim 1, further comprising a circuit assembly, wherein the circuit assembly comprises a circuit-assembly immovable portion that is parallel with the first direction and a circuit-assembly movable portion that is not parallel with the first direction, and the circuit-assembly movable portion is movable relative to the movable part and the immovable part.

14. The optical element drive mechanism as claimed in claim 13, wherein the circuit-assembly immovable portion comprises a plurality of pins, and when viewed from a direction that is perpendicular to the first direction, the pins at least partially overlap the immovable part.

15. The optical element drive mechanism as claimed in claim 13, wherein when viewed from the first direction, the circuit-assembly movable portion has a Y-shaped structure.

16. The optical element drive mechanism as claimed in claim 13, wherein the sensing assembly comprises a reference element and a sensing element detecting the reference element to find out a position of the movable part, and when viewed from the first direction, the reference element and the sensing element are located at a side where the circuit-assembly immovable portion is located.

17. The optical element drive mechanism as claimed in claim 16, wherein the movable part comprises a holder, a recess is formed on a top surface of the holder, and the reference element is disposed in the recess.

18. The optical element drive mechanism as claimed in claim 1, wherein the drive assembly further comprises another piezoelectric element with substantially the same structure as the piezoelectric element.

19. The optical element drive mechanism as claimed in claim 1, wherein a portion of the immovable part that surrounds the transmission element comprises a concave structure.

20. The optical element drive mechanism as claimed in claim 1, wherein the immovable part comprises a bottom, and the bottom comprises a bottom stage having a step-like structure.

* * * * *